Figure 1:
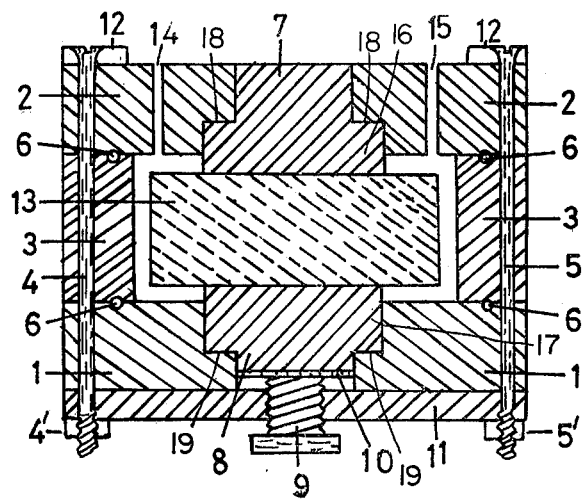

United States Patent [19]

Barter et al.

[11] 4,076,791
[45] Feb. 28, 1978

[54] MOLDS FOR ENCAPSULATING ELECTRICAL COMPONENTS

[75] Inventors: Frederick William Barter, Newmarket; Peter James Douglas Victor Brett, Sawston, both of England

[73] Assignee: Ciba-Geigy Corporation, Ardsley, N.Y.

[21] Appl. No.: 691,968

[22] Filed: Jun. 1, 1976

[30] Foreign Application Priority Data

Jun. 4, 1975 United Kingdom ............... 24062/75

[51] Int. Cl.$^2$ ..................... B22D 19/00; B29C 6/04; B29F 1/10
[52] U.S. Cl. ..................... 264/272; 249/83; 249/134; 264/275; 425/125
[58] Field of Search ............... 264/271, 272, 275, 278; 249/83, 142, 55, 149, 150, 92, 94, 96, 134, 140, 91, 95; 269/286, 285; 425/125, 129; 164/43, 219, 277, 337

[56] References Cited

U.S. PATENT DOCUMENTS

| 2,341,364 | 2/1944 | Crumrine | 264/278 X |
| 3,135,232 | 6/1964 | Fell | 249/134 X |
| 3,525,966 | 8/1970 | Wierzbinski | 264/275 X |
| 3,813,763 | 6/1974 | Church | 264/275 X |

FOREIGN PATENT DOCUMENTS

| 1,297,831 | 5/1962 | France | 249/83 |
| 1,222,651 | 2/1971 | United Kingdom | 164/43 |

Primary Examiner—Francis S. Husar
Assistant Examiner—John S. Brown
Attorney, Agent, or Firm—Harry Falber

[57] ABSTRACT

A mold is described for the encapsulation of electrical components with a thermosetting resin composition, particularly components which have either no lead-out wires or such wires which are not suitable for locating the component within the mold. Fitted into opposing walls of the case of the mold are at least one pair of solid plugs of a flexible material, the plugs extending into the interior of the mold and being of a material which has a higher coefficient of cubic expansion than that of which the mold is constructed. The plugs are arranged to grip the component even though the mold walls expand outwards when the mold is heated to cure the thermosetting resin.

9 Claims, 2 Drawing Figures

MOLDS FOR ENCAPSULATING ELECTRICAL COMPONENTS

This invention relates to new molds suitable for the encapsulation of components, especially such components having no intrinsic means of location within a mold, to a method of encapsulating components using such molds, and to components encapsulated by that method.

Encapsulation (often termed "embedding") of electrical components in an electrically-insulating thermosetting resin composition is a well known technique, serving, as well as insulating the components, to protect them from the atmosphere and from mechanical shock. Most electrical components have lead-out wires and are encapsulated by fixing the component in a mold by means of these wires, filling the mold with a thermosetting resin composition in liquid form, and allowing or causing the resin to cure, usually by the application of heat.

Some electrical components, however, such as coils, resistors, and especially ceramic capacitors, have either no lead-out wires or lead-out wires which are not suitable for locating the component within a mold and so they require to be held in position in the mold by pressure from some part of the mold itself. However, should the mold change its shape or dimensions, as when, on it being heated to cure the resin composition, the mold walls expand outwards, the component may become free to move within the mold. Such movement usually results in an unsatisfactory product, since, as a consequence of the component approaching too closely to the inner walls of the mold, not all its surfaces will be covered by a sufficient thickness of the resin composition and so, not being satisfactorily insulated, the component must be rejected.

There is therefore a need for a mold in which a component to be encapsulated is held in place such that subsequent heating of the mold does not result in loosening of the restraint exerted upon movement of the component.

We have discovered that this object may be substantially achieved by gripping the component between a pair of plugs of a flexible material fitted into the mold the material of which the plugs are constructed having a higher coefficient of cubic expansion than that of which the mold is constructed; when the mold is heated and its walls expand outwards, the plugs expand proportionally more, compensating for the effects of the movement outwards of the mold walls, and so their grip on the component is retained. Of course, the plugs are arranged so that, on expansion, movement of at least one of them is substantially entirely towards the component.

Accordingly, this invention provides a mold for the encapsulation of a component, especially an electrical component, and particularly one having no lead-out wires, with a thermosetting resin composition, which comprises i. a rigid outer case,
ii. fitted into opposing walls of the case, at least one pair of solid plugs of a flexible material, the plugs extending beyond the inner face of the walls into the interior of the mold and being constructed of a material having a higher coefficient of cubic expansion than that of which the mold is constructed,
iii. detent means present in said opposing walls for engaging said plugs and preventing their movement in a direction opposite to the position of said component, and
iv. means for advancing at least one such plug towards the centre of the mold, the plugs expanding to retain substantially their grip on the component when the mold is heated.

There is also provided a method of encapsulating a component which comprises i. placing the component within a mold of this invention,
ii. advancing at least one plug so that the component is firmly gripped between a pair of plugs,
iii. filling the mold with with a thermosetting resin composition, and
iv. heating the resin composition to cure it.

There are further provided components encapsulated by the method of this invention.

The case of the molds is suitably of metal or a thermoset resin composition. The plugs are suitably of a thermoplastics or rubbery material having an adequate coefficient of cubic expansion, but may be partially of metal: being of a flexible material, they do not damage the component but they must not, of course, become too soft at the curing temperature. If desired, the molds may have more than one such pair of plugs opposing each other, such as when more than one component are to be encapsulated at the same time in the mold. The plug or plugs may be advanced for initially grasping the component by means such as a screw.

Figure 2:
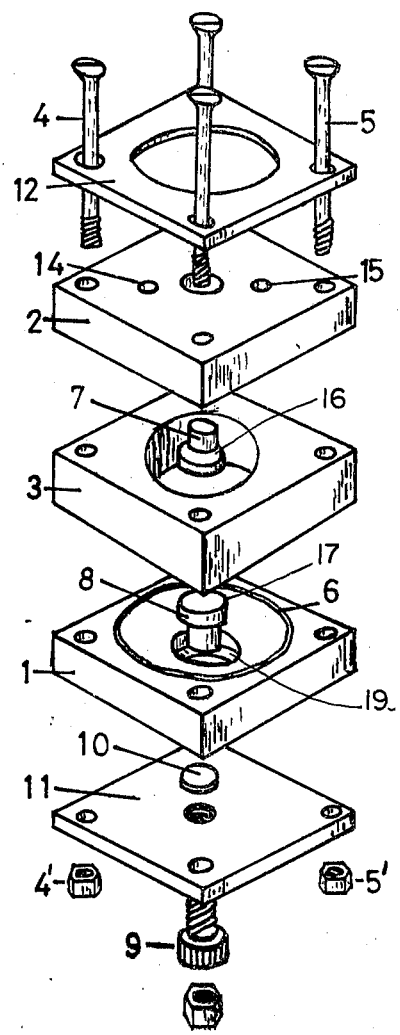

The new mold will now be illustrated by reference to the accompanying drawings, in which
FIG. 1 shows a cross-section, and
FIG. 2 shows an exploded view, of a typical mold of the present invention.

Upper and lower sections 1 and 2 are clamped to a middle section 3 by bolts 4 and 5, the joints being sealed by O-ring seals 6. Inserted into the sections 1 and 2 are plugs 7 and 8 of a thermoplastics material, one (8) of which abuts a screw 9 which engages a metallic support plate 11, direct contact between the plug 8 and the screw 9 being prevented by a metal disc 10. Another support plate 12 holds the other end of the assembly. The component to be encapsulated, 13, is held in position by pressure from the plugs 7 and 8, any gap between the plugs and the component being taken up by tightening the screw 9 which advances the plug 8. Plugs 7 and 8 are generally shaped to exhibit flanges 16 and 17 which engage shoulders or detent means 18 and 19 in sections 1 and 2, respectively, of the mold. In this manner, detent means 18 and 19 prevent the movement of plugs 7 and 8 in a direction away from component 13 during thermal expansion of the plugs and ensure constant, secure gripping of component 13. The encapsulating resin composition is passed through vents 14 and 15 to fill the interstices between the component 13 and the inner surfaces of the mold.

Specific suitable materials for the rigid sections of the mold are metals such as aluminum, iron, and steel, or thermoset resins, such as cured epoxide resins, which may contain a mineral filler, or especially a metallic filler, such as powdered aluminum or powdered iron, to enhance the thermal conductivity.

Suitable materials for the solid plugs (such as 7 and 8) include nylons, polytetrafluoroethylene, polyethylene, flexible (thermoplastic) polyurethanes, polypropylene, and silicone rubbers.

These drawings illustrate one type of mold according to the present invention. Obviously, modifications may be made to suit individual requirements. For example, the bolts 4 and 5 may be replaced by other clamping devices such as toggle catch fasteners; the mold may be made in two sections, instead of three; the plug 7 may contact a screw in a similar manner to plug 8. These, and other, modifications will readily occur to the skilled mold maker and are within the scope of the present invention.

Theromsetting resins used in encapsulation by means of the molds of the present invention are suitably those conventionally used for encapsulating electrical components, such as phenol-formaldehyde, polyurethane, alkyd and other polyester, silicone, and especially epoxide, resins.

Encapsulated components made by the method of the present invention will have areas free from the thermoset resin composition, caused by the contact with the plugs during encapsulation. If it is desired to make electrical contact through these surfaces, these areas may be left uncovered; if not, they may be coated with the encapsulating resin composition in a second stage using known techniques. In methods of the prior art, in which the encapsulated components had on their surfaces zones where there was little or none of the thermoset resin composition because the components had contacted, or nearly contacted, the walls of the mold there was the disadvantage that the distribution of such zones on the components was often random.

This invention will now be further illustrated by the following Example in which the temperatures are in degrees Celsius.

EXAMPLE

A mold as illustrated in FIGS. 1 and 2 was made of an epoxide resin filled with aluminum powder. The mold pieces had side 92 mm long, the upper and lower pieces being 12 mm thick and the middle piece being 23 mm thick. The upper and lower pieces had polypropylene plugs 20 mm in diameter across their heads and 10 mm in diameter across their stems. The circular cavity in the middle piece was 49 mm in diameter. The whole mold was held together with four bolts acting on upper and lower aluminum plates 5 mm thick.

The inner surfaces of the mold were treated with a silicone release agent and a ceramic capacitor 44 mm in diameter and 20 mm thick, previously degreased in trichloroethylene, was placed in the mold so that it was equidistant from the inner surfaces of the mold. The clamping screw was tightened until the capacitor was firmly held between the polypropylene plugs. The mold was then heated to 75° to 80°.

A mixture was prepared, containing a commercially-available epoxide resin (viz., a diglycidyl ether of 2,2-bis(4-hydroxyphenyl)propane), powdered calcium carbonate as a filler, blue colouring paste, with a curing amount of bis(4-aminophenyl)methane as the curing agent. This mixture was heated to 70° and degassed at 0.5–1 mm Hg.

The heated mold was evacuated to 0.5 mm Hg and filled with the resin mixture in a proprietary casting plant using the vacuum differential technique. The filled mold was maintained at 65° for 8 hours to cure the resin.

The capacitor was then removed from the mold without difficulty and was, except where the plugs gripped it, uniformly encapsulated.

We claim:

1. A mold for encapsulation of a component with a thermosetting resin composition which comprises
   i. a rigid outer case provided with means for introduction and removal of the component,
   ii. fitted into opposing walls of the case, at least one pair of solid plugs of a flexible material, the plugs extending beyond the inner face of the walls into the interior of the mold and being constructed of a material having a higher coefficient of cubic expansion than that of which the mold is constructed,
   iii. detent means present in said opposing walls for engaging said plugs and preventing their movement in a direction opposite to the position of said component, and
   iv. means located in the wall of the case for advancing at least one such plug towards the center of the mold to grip the component,
the plugs expanding to retain substantially their grip on the component when the mold is heated.

2. A mold according to claim 1, in which the rigid outer case is further provided with at least one orifice for introduction therein of the composition.

3. A mold according to claim 1, containing more than one such pair of plugs.

4. A mold according to claim 1, in which the said case is of metal.

5. A mold according to claim 1, in which the said case is of a thermoset resin.

6. A mold according to claim 5, in which the said thermoset resin contains a heat-conductive filler.

7. A mold according to claim 1, in which the plugs are of a nylon, polytetrafluoroethylene, polyethylene, a thermoplastic polyurethane, polypropylene, or a silicone rubber.

8. A mold according to claim 1, in which the said means for advancing a plug comprises a screw.

9. A method of uniformly encapsulating an electrical component with a thermoset resin composition which comprises
   i. placing the component within a mold and positioning said component therein by means of at least one pair of solid, flexible plugs, said plugs being positioned on opposing sides of said component and in contact with detent means in said mold to prevent their movement in a direction opposite to the position of said component, and being constructed of a material having a higher coefficient of cubic expansion than that of which said mold is constructed;
   ii. advancing at least one plug toward the center of the mold so that the component is firmly gripped between said pair of plugs;
   iii. filling said mold with said thermosetting resin composition to cover all exposed surfaces of said component, and
   iv. heating said resin composition to cure it, the thermal expansion of said plugs in the direction of said component holding said component in position during said curing.

* * * * *